(12) United States Patent
Battersby

(10) Patent No.: US 6,639,821 B2
(45) Date of Patent: Oct. 28, 2003

(54) MEMORY CIRCUIT WITH MEMORY ELEMENTS OVERLYING DRIVER CELLS

(75) Inventor: Stephen J. Battersby, Haywards Heath (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/206,313

(22) Filed: Jul. 26, 2002

(65) Prior Publication Data

US 2003/0035338 A1 Feb. 20, 2003

(30) Foreign Application Priority Data

Aug. 17, 2001 (GB) .............................................. 0120113

(51) Int. Cl.⁷ .................................................. G11C 5/06
(52) U.S. Cl. .......................... 365/63; 365/105; 365/130
(58) Field of Search ................................. 365/105, 130, 365/63

(56) References Cited

U.S. PATENT DOCUMENTS

| | | | |
|---|---|---|---|
| 4,442,507 A | 4/1984 | Roesner | 365/100 |
| 4,646,266 A | 2/1987 | Ovshinsky et al. | 365/105 |
| 5,835,396 A | * 11/1998 | Zhang | 365/51 |
| 5,915,167 A | 6/1999 | Leedy | 438/108 |
| 5,969,380 A | * 10/1999 | Seyyedy | 257/295 |

FOREIGN PATENT DOCUMENTS

| | | | | |
|---|---|---|---|---|
| WO | WO9509438 | 6/1995 | | H01L/25/18 |
| WO | WO9619837 | 6/1996 | | H04L/45/00 |

* cited by examiner

Primary Examiner—Richard Elms
Assistant Examiner—Jung H. Hur
(74) Attorney, Agent, or Firm—Aaron Waxler

(57) ABSTRACT

A memory device includes an array of memory elements overlying a plurality of driver cells. Vias through an insulating layer connect the driver cells to the memory elements. The vias are distributed over the area of the array to connect the individual driver cells to the respective row and and/or column conductors of the memory array.

10 Claims, 6 Drawing Sheets

MEMORY CIRCUIT WITH MEMORY ELEMENTS OVERLYING DRIVER CELLS

The invention relates to a memory circuit, and in particular to a memory circuit with integrated row and column drivers.

A large number of approaches to electronic data storage are currently commercially successful. These include solid state storage, optical storage and magnetic storage. Solid state storage, typically DRAMs, SRAMs, FLASH, EEPROMs, mask ROMs and other types offer the advantages of no moving parts, fast access, high data rate, random access and lower power consumption. They are however relatively expensive. Optical storage, such as CD, mini disk, DVD or optical tape formats have a low cost per bit and are easy and cheap to replicate. However, they only achieve the low costs per bit at high volumes, and further suffer from the disadvantage of relatively long access times, low data rates, bulk and only quasi-random access. Magnetic storage such as hard or floppy disk drives have similar properties to optical storage, although frequently with lower data densities.

There has therefore been an on-going desire to find mass storage technology that achieves the benefits of the solid state approaches mentioned above but at lower cost.

A number of approaches to achieving low cost solid-state memory have been proposed. One proposal is to replace crystalline semiconductor memory structures such as DRAMs and SRAMs with an alternative structure using a simple cross-over to achieve a memory element at each cross-over. Such structures are sometimes known as anti-fuses. Typically, a metal semiconductor metal (MSM) structure is used where a semiconductor material such as amorphous silicon, silicon-rich silicon nitride or a polymer semiconductor is sandwiched between two metal layers. A memory array is then formed using the semiconductor layer to separate a grid of metal tracks running in one row direction from an overlying grid of metal tracks running othogonally, in a column direction. By addressing a specific row and a specific column, it is possible to access the MSM device at the cross-over point between the tracks.

In order to ensure that only the device at the cross-over is read, it is necessary to provide suitable driver circuitry to ensure only the device at the cross-over point is read. Further, there is a need to define the device itself to allow it to switch between two states with electrically different properties.

The advantage of the cross-over structure is its small size. Assuming the smallest lithographic feature size to be F, a single cross-over element can be fitted into an array of for $F^2$. This is because each of the orthogonal metal grids may have a line width of F and an inter-line spacing of F which results in an area of each of the cells of $(2F)^2$. Alternative memory cells based on transistors occupy at least double this.

Suitable structures are known, for example from WO 96/19837 to Philips Electronics NV.

An example of an alternative approach which aims at a high density is that described in U.S. Pat. No. 4,646,266 to Ovshinsky et al. In this approach, multiple layers of cross-over structures are used together with driver electronics arranged generally around the multiple layers. However, the complexity of the driver and the area required for the driver circuits is considerable.

Moreover, the improvement in the size of the cell using cross-over structures is not enough to offset the larger feature size used in such thin-film processes as compared with conventional processes used to fabricate conventional transistors.

Furthermore, it is not sufficient merely to provide memory cell arrays. It is also necessary to provide row and column drivers and these are generally much larger than individual memory cell elements.

A further device is U.S. Pat. No. 4,442,507 to Roesner which describes an electrically programmable read only memory in which a memory cell array is stacked above a semiconductor substrate. Row electrodes and column electrodes each extend across the full width of a memory cell array and individual memory cells are defined at the crossing points. Vias provided at the ends of the row and column electrodes extend downwards through the memory cell array to a driver electronics layer provided on the semiconductor substrate.

It is an object of the present invention to further improve memory cell density in a memory cell array.

According to the invention, there is provided a memory device comprising: a substrate extending in a plane; an array of memory elements arranged in a plurality of rows and a plurality of columns arranged substantially parallel to the plane of the substrate and over a predetermined area of the substrate; a plurality of row conductors extending along the rows of memory elements and connecting to the memory elements of the respective rows; a plurality of column conductors extending along the columns of memory elements and connecting to the memory elements of the respective columns; a plurality of driver cells containing drivers for driving the row and/or column conductors, arranged in a layer between the memory array and the substrate, and an insulating layer between the driver cells and the array of memory cells, a plurality of conductors passing through the insulating layer distributed over the predetermined area connecting the driver cells to corresponding row or column conductors.

Thus, in the invention drivers are arranged in an array underneath the memory array.

Accordingly, the drive electronics can use most or all of the area of the array of memory elements, saving space.

Preferably, the driver cells each include a column driver. The row drivers may be incorporated into the same cells; alternatively, the row drivers may be arranged around the array of memory elements and the driver cells under the array of memory elements may provide the column drivers.

Preferably, the array of memory elements is spaced from the array of driver cells by an insulating layer, and via holes through the insulating layer are provided to connect the driver cells with column conductors of the array of memory elements.

Conveniently, an insulating layer is provided between the array of driver cells and the array of memory cells, and conductive vias may connect the column drivers of the driver cells with corresponding column conductors.

Preferably, each column of driver cells underlies a number of column conductors and each column driver in each column of driver cells is connected to a different one of the number of column conductors. In this way, each column conductor may be connected to a corresponding column driver.

Conveniently, the row drivers may be arranged outside the area of the memory array.

In a particularly preferred embodiment of the invention, instead of a single array of memory elements, a stack comprising a plurality of such arrays is provided, each array including a plurality of rows and columns of memory elements arranged superstantially parallel to the planes of the substrate.

Preferably, each column driver drives a column in exactly one of the stack of arrays and not in other arrays.

In order to provide passages for vias between drivers and column conductors in layers other than the lowest layer of the stack, lower layers of the stack preferably have gaps wherein no memory elements are defined. Vias may pass through these gaps to connect column drivers on one side of the gap to memory array layers on the other side of the gaps.

Each row driver may drive a row in each of the stack of arrays of memory elements. This allows for easier connection.

Alternatively, each row driver may drive a row in a single one of the layers. In this way, row addressing does not need to drive the capacitance of rows in each of the layers to thereby speed up access times.

The invention also relates to a method of manufacturing a memory device on a substrate extending in a plane, including defining an array of driver cells including at least column drivers over the substrate; depositing an insulating layer over the array of driver cells; depositing a plurality of column conductors over the insulating layer; defining an array of memory elements arranged in a plurality of rows and a plurality of columns substantially over the array of driver cells; and depositing a plurality of row conductors.

For a better understanding of the invention, the same will now be described, purely by way of example, with reference to the accompanying drawings in which.

Figure 1:
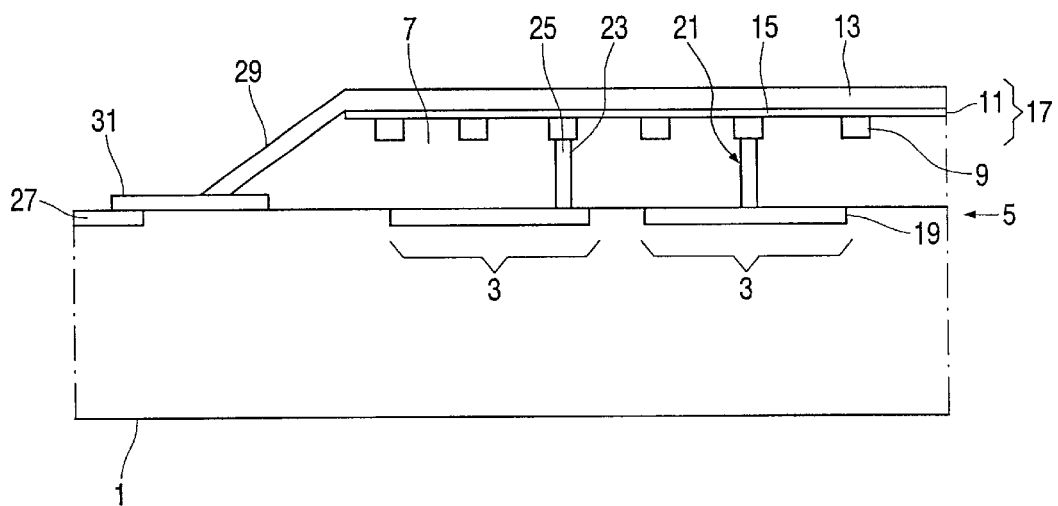
FIG. 1 shows a cross-section through memory cell array with column and row drivers.
Figure 2:
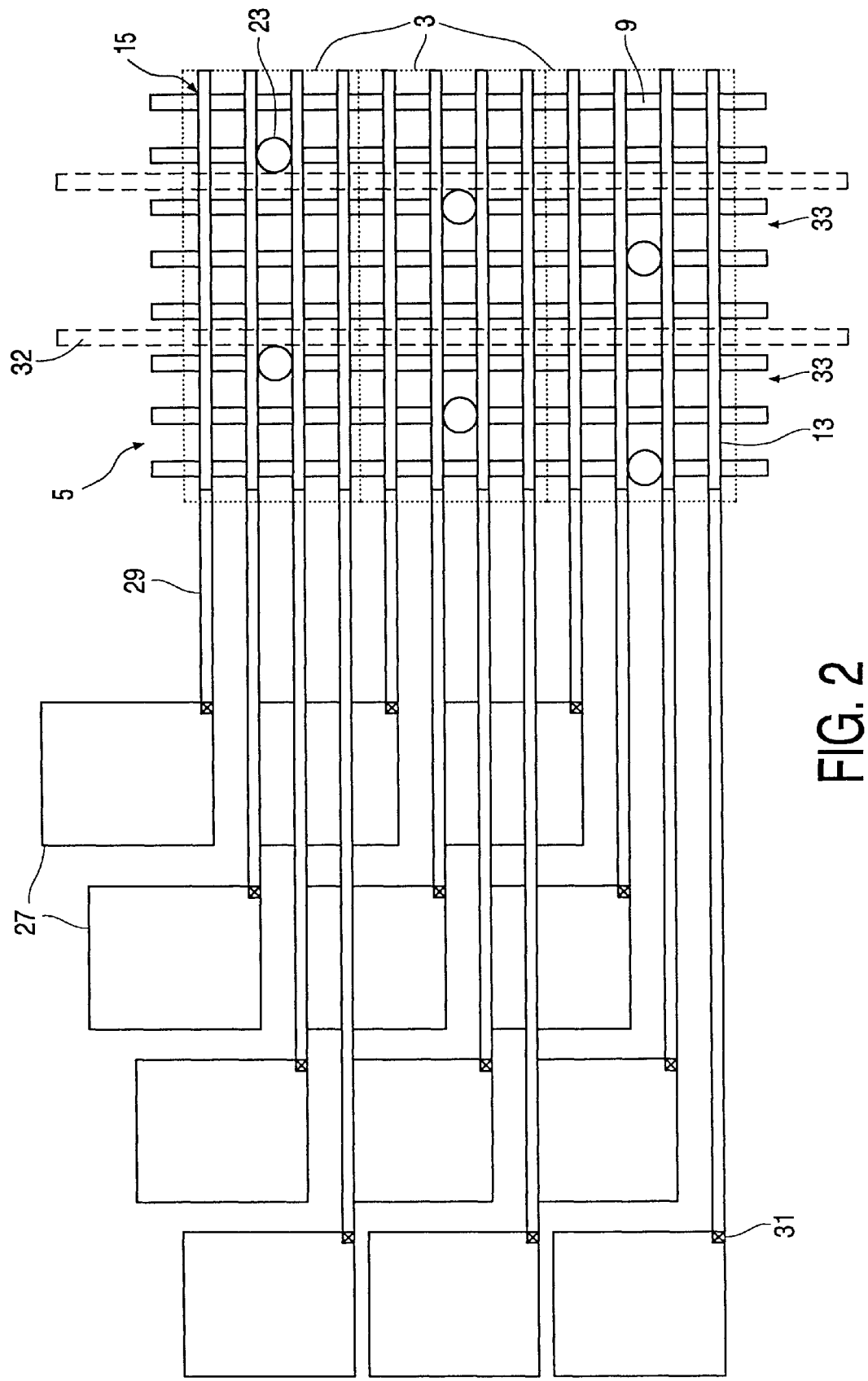
FIG. 2 shows a top view of the array shown in FIG. 1.

FIGS. 1 and 2 show a memory apparatus according to a first illustrative embodiment of the invention. The apparatus is formed on a substrate 1, conveniently a semiconductor substrate. A plurality of driver cells 3 are defined forming a sub-array 5 over the area of the substrate. The driver cells are indicated by dotted lines in FIG. 2 because other components, to be described later, are formed over the cells.

The driver cells 3 include decoder circuitry and driver circuitry. They are manufactured in a conventional way using conventional semiconductor technology, or thin film technology, which will not be described further.

An insulating layer 7 is provided over the driver layer. Above the insulating layer 7 are provided column electrodes 9, extending in a column direction across the substrate 1 substantially parallel to the plane of the substrate 1. A semiconductor layer 11 is provided above the column electrodes 9, with row electrodes 13 being provided above that. The row electrodes 13 extend substantially parallel to the plane of the substrate but substantially orthogonally to the column electrodes 9. In the embodiment described, the semiconductor layer is of amorphous silicon.

The row electrodes 13, column electrodes 9 and semiconductor 11 layer form a memory cell array 17 extending over the same area of the substrate 1 as the sub-array 5 of driver cells 3.

Each crossover 15 between a row electrode 13 and a column electrode 9 forms a single memory element 15, which can be addressed by providing suitable signals on the row 13 and column 9 electrodes. The memory cell can be written to by providing large voltages on the row and column electrodes to change the state of the semiconductor of the layer 11 at the crossover. The reading of the memory cell can be carried out using smaller voltages on the row and column electrodes. Suitable reading and writing protocols are well known in the art.

Although the illustrated embodiment shows only a single semiconductor layer 11 alternative arrangements are also suitable. For example, a memory element may be formed from a layer of insulating material, such as silicon nitride, or a multilayer structure for example including both semiconductor layers and insulating layers.

The invention is also applicable to read only memories in which the data is stored in the memory elements during manufacture rather than as a result of a subsequent programming step.

Indeed, the invention is not limited to cross-over style memory cell elements but the arrangement of the invention may be applied to any memory having arrays of memory cell elements driven by row and column electrodes, which includes substantially all types of memory, including DRAM, SRAM, and other forms of memory well known in the art.

In the illustrated embodiment the driver cells 3 each include a single column driver 19 for driving a corresponding column electrode 9 of the memory cell array 17.

The column drivers 19 are connected to the corresponding column electrode 9 through corresponding conductive vias 21. The conductive vias 21 are formed as via holes 23 defined in the insulating layer 7 filled with conductive material 25. The via holes 23 are distributed over the area of the array 17 so that each column electrode 9 is connected to a single column driver 19. Row drivers 27 are arranged outside the area of the column drivers and the memory cell array 17, and connected to corresponding row electrodes 13 by interconnects 29 connected to a driver pad 31 on each row driver 27. A data bus 32 is arranged to pass through each driver cell 3.

The substantial amount of area taken up by the row drivers 27 can be seen in FIG. 2. A similar amount of area would also need to be taken up by the column drivers 5, if they were not arranged under the memory cell array 17.

The present invention thus greatly eases the problem of interconnecting the driver cells to the column electrodes, whilst greatly reducing the area around the array required for driver electronics. FIG. 2 illustrates the large area required for the row drivers around the periphery of the memory cell array, but in most prior art arrangements it would be necessary to provide a similar area for the column drivers.

The arrangement described in U.S. Pat. No. 4,442,507 provides vias to connect to the rows and column electrodes around the outside of the memory cell array 17 rather than distributed over the area of the array as in the present invention. Such an arrangement would make it much more difficult to arrange the drivers and the interconnections to the row or column electrodes since it would be necessary to bring each drive signal along interconnections to the correct location at the edge of the array. In addition to the difficulty of arranging and routing, significant area would need to be taken up with the interconnections. Thus, the arrangement of the invention increases the space for the column decoder and driver operation.

The driver cells of the invention are distributed in a regular sub-array extending in the row and column directions parallel to the row and column conductors respectively. This also assists in packing in the driver cells in the available space below the memory cell array. A number of column electrodes are arranged above each column of driver cells. In FIG. 1, four column electrodes 13 are shown above the first column 33 of driver cells. In practice there may be more. Each column electrode 13 above the first column 33 of cells is connected to one of the driver cells 3 by vias 21.

In an arrangement according to the invention the cells can be made and distributed in any of a large number of ways. However, it is of interest to minimise the number of cells consistent with driving the column electrodes, because this maximises the area of each driver cell which eases the design of the driver cells.

Figure 3:
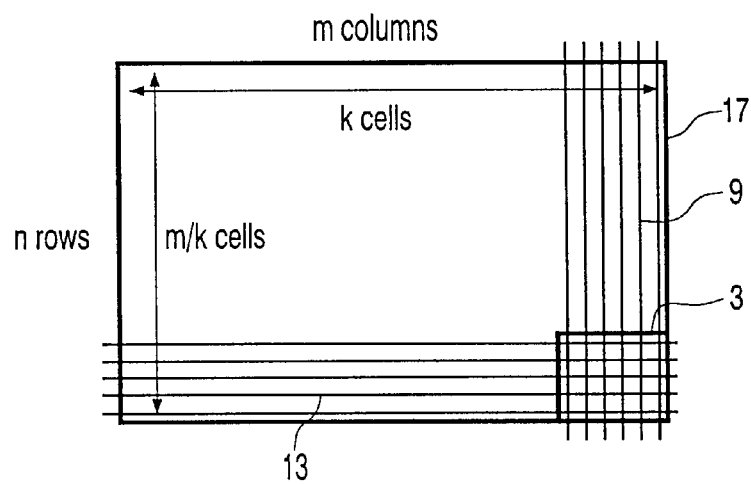
FIG. 3 shows a schematic top view of the memory cell device according to the invention.

Consider the example (FIG. 3) of a memory array 17 having m columns and n rows of memory elements 11, and let there be k driver cells 3 across the array, in the row direction. For clarity, only a single driver cell 3 is depicted. Therefore, each driver cell lies under m/k different column electrodes 9, and so there need to be m/k driver cells in each column so that each cell can drive one column. There are thus m driver cells 3 in all. The row electrodes 13 are driven by row drivers 27 at the edge of the array.

Since the number of cells in each row and column must all be integers, m, n, k, m/k and nk/m must all be integers. For example if m=10000, n=5000, n/m=½ and so suitable values of k are 20, 50, 100, 200.

The description above makes it clear that there are a minimum of m cells each of which contains one column driver 19. In a modification, the cells 3 may also contain row drivers 27. For our m×n array, only n row drivers 27 are required (n is assumed to be less than m) so m cells 35 are more than sufficient to accommodate the row drivers. Indeed, each horizontal row of cells 3 in the sub-array has k cells but only nk/m<k rows to drive. With sufficient cells occupied by row drivers to drive these nk/m rows, the remaining k(1−n/m) cells could therefore be used for other purposes.

For convenience, a square array 17 and sub-array 5 will now be considered, purely by way of example. That is n=m, k=√m. For a square array, the situation is rather neater. For a m×m array, there are √m cells both horizontally and vertically in the sub-array, yielding m cells altogether, each of which must contain one column driver and one row driver to address the whole array. Finally, it may be helpful to place the row drivers 27 outside the array altogether as in the first embodiment. The reason for doing this will become clear later.

Figure 4:
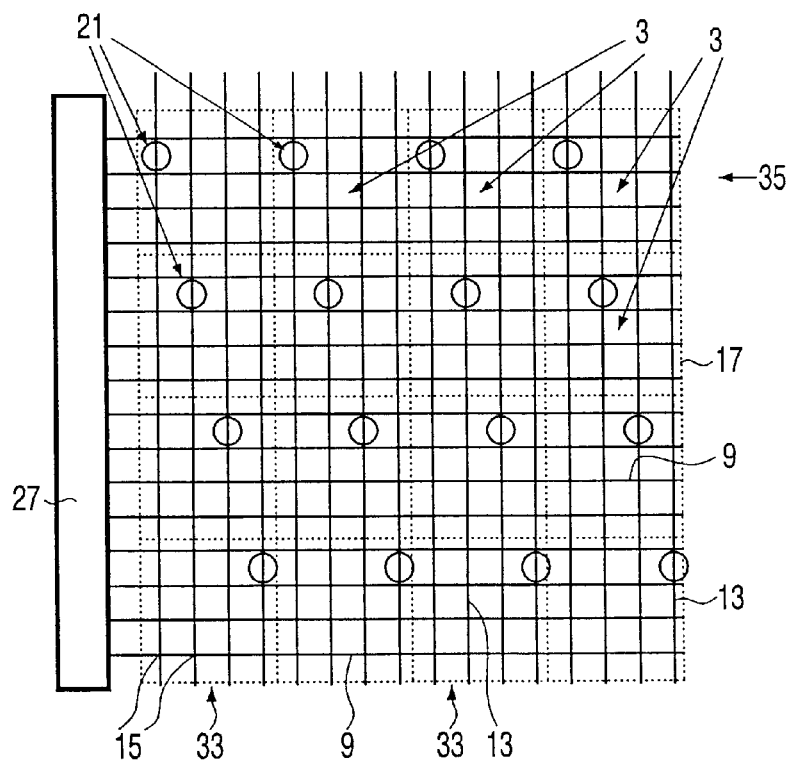
FIG. 4 shows a schematic top view of a second embodiment of a memory device according to the invention.

The interconnection between the overlying memory array and the column driver sub-array is illustrated schematically in FIG. 4 for a square array of 16×16 rows and columns of memory cell elements 15. The row drivers 27 are located to one side of the array and are at a different level from the memory array. The small circles 21 represent vias in the dielectric layer 7 which separates the driver sub-array 5 from the memory array 17 and allows the two 5, 17 to be electrically connected. (A rectangular array can also be chosen but, for reasons outlined above, a square array is especially straightforward). The driver cells 3 are arranged as a plurality of rows 35 and columns 33. Each column 33 of driver cells 3 underlies four column electrodes, 13, and the four driver cells 3 in each column each drive a different one of the four overlying column electrodes 13.

Figure 5:
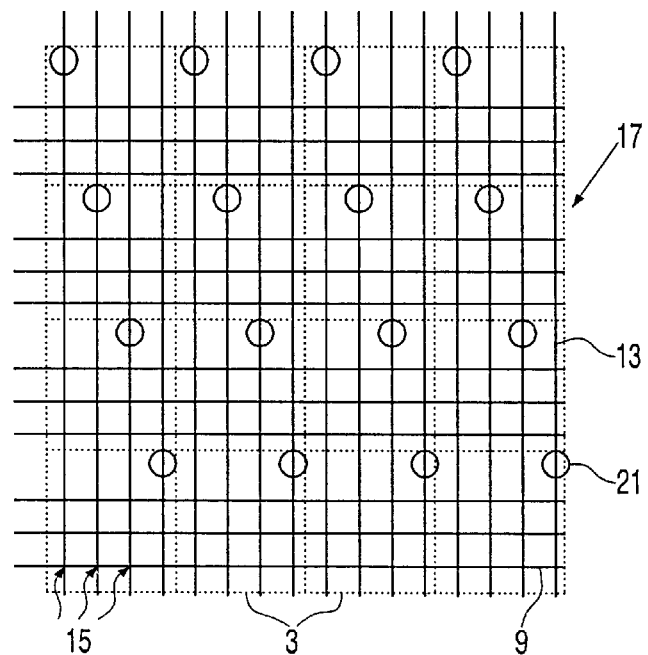
FIG. 5 shows a schematic top view of a third embodiment of the invention.

FIG. 5 shows an alternative embodiment in which one row electrode 9 over each cell 3 in the sub-array 5 is omitted in order to allow for alignment errors in the via hole 21 pattern. In this case, the memory array is actually 16×12 memory elements 15. In fact, for a general square array of m×m element 15, omitting one row electrode 9 per cell 3 to allow interconnection to column drivers 19 in an underlying sub-array implies √m−1 rows of memory elements 15 per cell 3 and hence √m (√m−1) rows per array and hence m×√m (√m−1) elements 15 per array 17. With m=$10^4$, the number of memory elements is $10^6$ ($10^2$−1)=0.99×$10^8$ rather than 1×$10^8$ one might expect without omitting one row per cell for the via 21.

Figure 6:
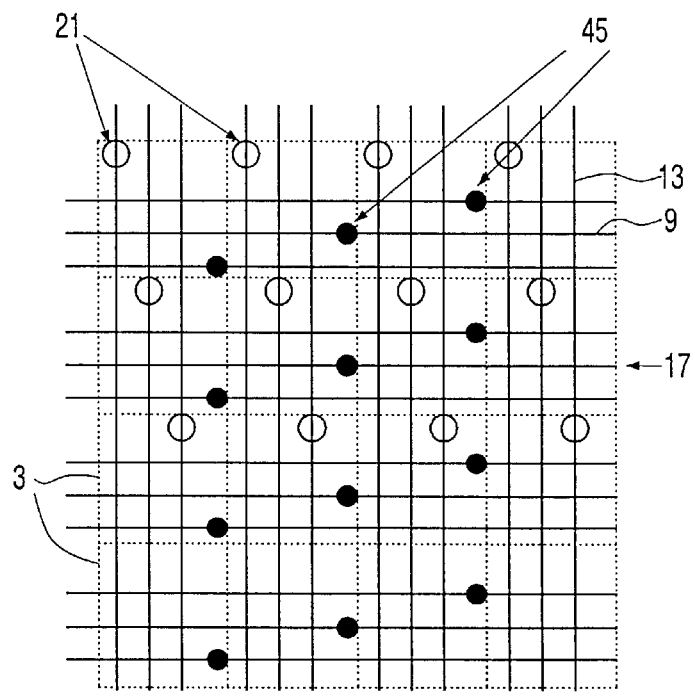
FIG. 6 shows a schematic top view of a fourth embodiment of the invention.

It is also possible to connect the row electrodes 9 to row drivers 27 under the array 17 as well. FIG. 6 shows this arrangement for a 12×12 array. Here, each cell 3 contains both a row driver 27 and a column driver 19 and there must be two via connections 21, 45 to the array 17 per cell 3. One fewer row electrode 9 and one fewer column electrode 13 per cell 3 than in the arrangement of FIG. 4 are provided in order to allow room for the row interconnect via hole 45.

For a general m×m array, omitting one row electrode 9 and one column electrode 13 over each cell 3 to allow interconnection to the underlying sub-array (now with both row 27 and column 19 drivers) implies √m−1 rows or columns per cell 3 and hence √m(√m−1) rows or columns per array and hence m(√m−1)$^2$ elements 15 per array. With m=$10^4$, the number of memory elements 15 is 0.98×$10^8$. With row drivers 27 present under the array, the cells 3 may be connected together in such a way that the carry signal in the shift register can pass from one cell 3 to another.

It is important to consider how much area there is in each cell 3 in the sub-array within which to fit the driver electronics. If we consider a technology capable of achieving 1 μm lines, spaces and alignments, the pitch of a 2F array would be 2 μm. Considering, for example, an array of m=$10^4$ elements 15, each cell 3 in the sub-array 5 would be 200 μm square which should normally be sufficient for the drive electronics with 1 μm design rules. Indeed, for a technology with a feature size, F, and an array of m elements, each cell 3 in the sub-array is 2×√m F square.

Figure 7:
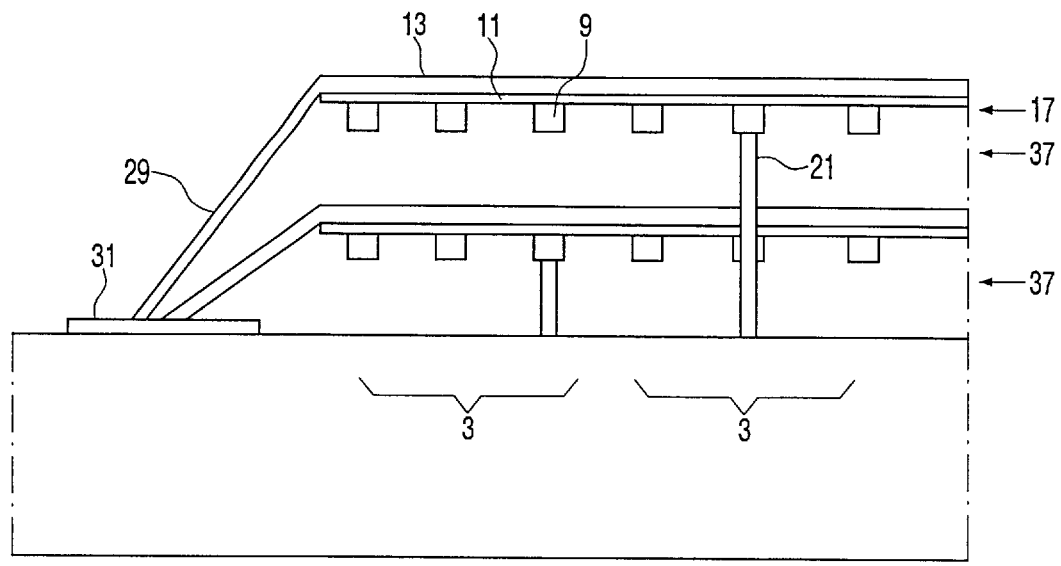
FIG. 7 shows a schematic side view of a fifth embodiment according to the invention.

Referring to FIG. 7, a further embodiment of the invention includes a number of layers 37 of memory cell arrays 17 with a single driver cell array 5. Each of the layers 37 of memory cell arrays may be formed largely as described above.

The only significant difference is that it is necessary to route vias 23 through the lower memory cell array layers 37 to reach the upper layers 37.

Figure 8:
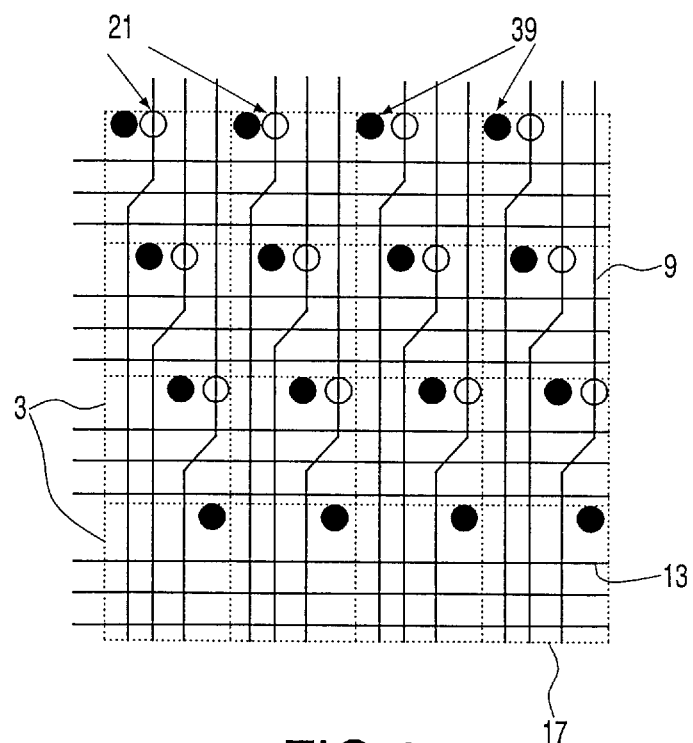
FIG. 8 shows a schematic top view of a sixth embodiment according to the invention.
Figure 9:
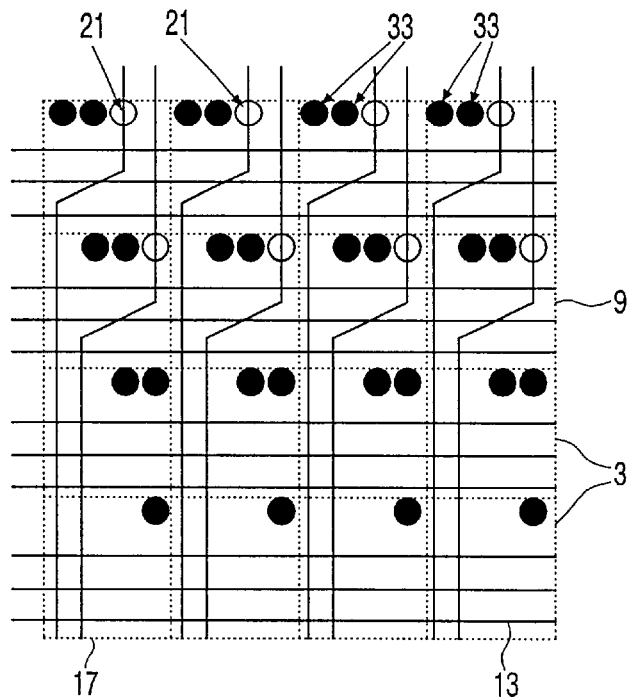
FIG. 9 shows a schematic top view of a seventh embodiment according to the invention.

FIG. 8 illustrates the arrangement of vias in a further embodiment in the second layer from the top of a multilayer structure, and FIG. 9 the arrangement in the third layer from the top. For clarity, a 4×4 array of sub-cells 3 is shown but in a real device there may be many more sub-cells 3, row electrodes 13 and column elements 9. Through via holes 39 pass through the layer from above, and connection via holes 21 connect to the column conductors 9. The rows are driven from the side, as in FIG. 7.

Let us now take p layers of memory. The uppermost layer looks identical to FIG. 5 for our nominal 16×12 array. The via holes must now pass through all of the underlying layers of memory elements. The memory layer one level down must have via holes of its own to the column drivers but must also miss the via holes from the layer above. In order to do this, we must omit one column per cell, as indicated in FIG. 8, so the array is now 12×12. For the next level down, an additional column must be omitted as indicated in FIG. 9, So the array is now 8×12 etc. Generalising this for a m×m array, the top layer contains m×√m (√m−1) elements, as above, the next layer down has m (√m−1)$^2$ elements, the layer below that has m (√m−1)(√m−2) elements, then next layer m ($\sqrt{m}-1$)($\sqrt{m}-3$) elements etc. The total array of p layers contains m ($\sqrt{m}-1$)(p $\sqrt{m}$-SUM j, from j=1 to p-1) elements. For m=$10^4$ and p=10, this gives $0.95 \times 10^9$ elements rather than $10^9$.

Figure 10:
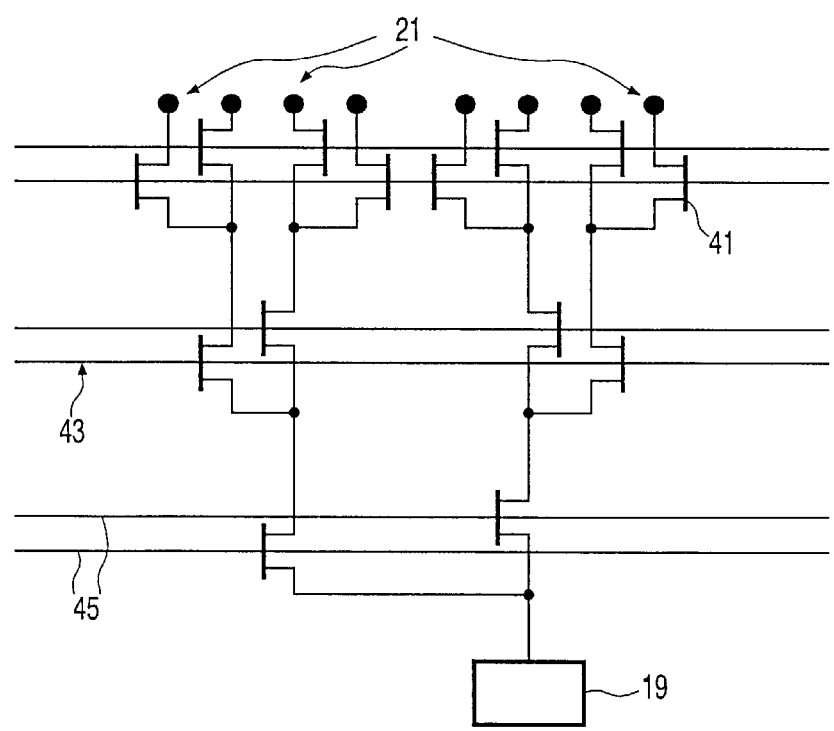
FIG. 10 shows a schematic side view of an eighth embodiment according to the invention.

For multilayers, the data bus 32 is as for the single layer memory. However, each sub-cell 3 must now contain an additional set of layer select transistors 41 and a layer select bus 43, as shown in FIG. 10. The layer select bus 43 contains 3 pairs of complementary layer select lines 45 to connect the driver 19 to a selected one of the vias 21. For n-channel only, this would typically require 6 lines in the select bus and 14 transistors to select one of 8 layers. Alternatively, this could use n- and p-channel devices, reducing the number of select lines to 3.

In all the foregoing, it is assumed that a via can be made within a gap 3F wide (which is formed by missing out either one row or one column where the via is required so the 3F gap is formed from the original spacing of F on each side of the missing row of column plus F for the row or column itself). It is possible that quite thick dielectric layers may be required in order to space the memory layers sufficiently far apart, both from each other and from the driver electronics, to reduce electrical interference. In this case, if the dielectric layer thickness starts to exceed the lateral feature size, it is likely that more than one row or column must be omitted to give more space for the via hole. By missing our 2 rows/columns, the space for the via becomes 5F, or 7F for missing out 3 rows/columns. This reduces the memory capacity somewhat, but still not drastically. For the single layer memory shown in FIG. 7, but with 3 rows omitted per cell in the sub-array to leave 7F space for the via, the number of memory elements is m×$\sqrt{m}$ ($\sqrt{m}-3$). For m=$10^4$, the number of elements is $0.97 \times 10^8$, compared to $0.99 \times 10^8$ when only 3F was allowed for the via hole. Accordingly, the benefits of the invention may be obtained also in this case.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

What is claimed is:

1. A memory device comprising:
   a substrate extending in a plane;
   an array of memory elements arranged in a plurality of rows and a plurality of columns arranged substantially parallel to the plane of the substrate and over a predetermined area of the substrate;
   a plurality of row conductors extending along the rows of memory elements and connecting to the memory elements of the respective rows;
   a plurality of column conductors extending along the columns of memory elements and connecting to the memory elements of the respective columns;
   a plurality of driver cells containing drivers for driving the row and/or column conductors, arranged in a layer between the memory array and the substrate, and an insulating layer between the driver cells and the array of memory cells, a plurality of conductors passing through the insulating layer distributed over the predetermined area connecting the driver cells to corresponding row or column conductors, wherein said column conductors are individually connected to the plurality of driver cells at a point along an entire column conductor's length.

2. A memory device according to claim 1 wherein the plurality of driver cells are arranged in a regular driver cell array extending across the predetermined area of the substrate.

3. A memory device according to claim 2 wherein the driver cells are arranged in a plurality of rows and columns parallel to the rows and columns respectively of memory cells and each column of driver cells underlies a number of column conductors and the drivers in each column of driver cells is connected to a different one of the number of column conductors which the column of driver cells underlies.

4. A memory device according to claim 1 wherein row drivers are arranged around the outside of the memory array.

5. A memory device according to claim 1 including a stack of arrays of memory elements, each array layer including a plurality of rows and a plurality of columns of memory elements arranged substantially parallel to the plane of the substrate, connected by row conductors and column conductors.

6. A memory device according to claim 5 wherein each column driver drives exactly one column conductor in one of the stack of arrays of memory elements.

7. A memory device according to claim 6 wherein at least one array of memory elements has gaps where no memory elements are defined and wherein vias pass through the gaps to connect the drivers on one side of the said at least one array of memory elements closer to the substrate to a further array of memory elements on the opposite side of the said at least one array of memory elements further from the substrate.

8. A memory device according to claim 5 wherein each row driver drives a row in each of the stack of arrays of memory elements.

9. A memory device according to claim 5 wherein each row driver drives a row in a single one of the stack of arrays of memory elements.

10. A method of manufacturing a memory device on a substrate extending in a plane, including
   defining an array of driver cells including at least column drivers over the substrate;
   depositing an insulating layer over the array of driver cells;
   depositing a plurality of column conductors over the insulating layer;
   defining an array of memory elements arranged in a plurality of rows and a plurality of columns substantially over the array of driver cells;
   depositing a plurality of row conductors; and
   connecting individual column conductors to their respective column drivers through the insulating layer at a point along the entire length of an individual column conductor, the connections distributed over the area of the array of memory elements.

* * * * *